United States Patent [19]

King et al.

[11] Patent Number: 4,629,987
[45] Date of Patent: Dec. 16, 1986

[54] METHOD AND APPARATUS FOR NUCLEAR MAGNETIC RESONANT MEASUREMENT OF FLOW VELOCITY

[75] Inventors: James D. King; Erroll S. Riewerts; William L. Rollwitz, all of San Antonio, Tex.

[73] Assignee: Southwest Research Institute, San Antonio, Tex.

[21] Appl. No.: 530,411

[22] Filed: Sep. 8, 1983

[51] Int. Cl.$^4$ .......................................... G01R 33/20
[52] U.S. Cl. ................................ 324/306; 73/861.05
[58] Field of Search ................ 324/306; 73/861.05, 73/861.06

[56] References Cited

U.S. PATENT DOCUMENTS 3,191,119 6/1965 Singer .................................. 324/306
3,562,632 2/1971 Kirkland ............................. 324/306

Primary Examiner—Stephen A. Kreitman
Assistant Examiner—Scott M. Oldham
Attorney, Agent, or Firm—Gunn, Lee & Jackson

[57] ABSTRACT

A method and apparatus are set forth for measuring flow velocity of an element of interest in a compound within a pipe. In the preferred and illustrated embodiment, a static magnetic field is imposed on the flowing material of interest. Preferably, a uniform field of finite width is imposed. There is a first coil around the path for imposing an RF magnetic field at right angles to the static magnetic field. There is a relationship between the flowing material including the element, frequency of the RF field and static magnetic field intensity which aligns nuclei or electrons of the element. There is a second (detection) coil spaced downstream from the first coil, the second coil also being around the pipe. By turning the first coil off or on, the NMR or EMR signal observed at the second coil can be made to change abruptly as the "tagged" element flows to the second coil. By measuring the time of travel of the element of interest evidenced by the second coil signal, the flow velocity can be measured. An alternate embodiment utilizes a magnetic field gradient at the coils to narrow the coil field dimensions.

21 Claims, 4 Drawing Figures

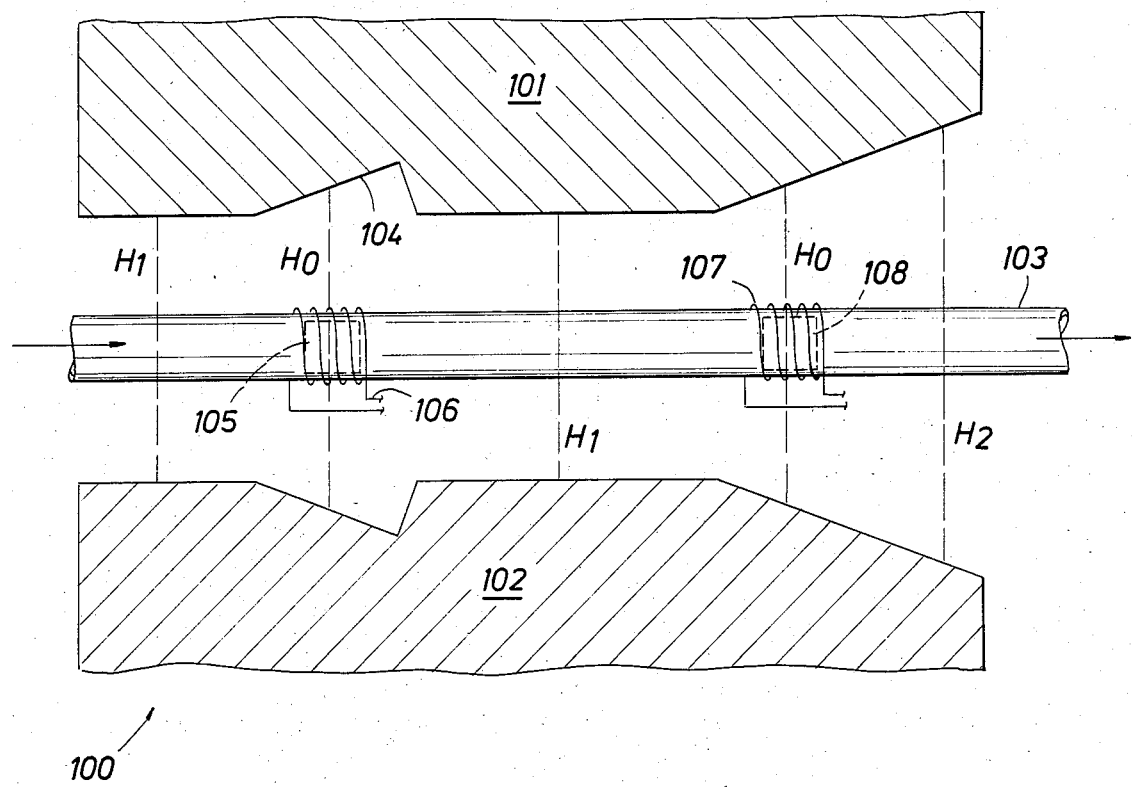
FIG. 3
FIG. 4
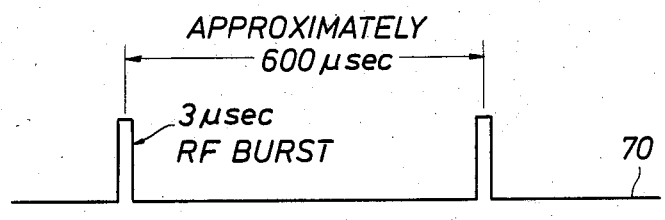
TRANSMITTER 28
SIGNAL FROM SAMPLE
AND HOLD AMP. 25
RECEIVER 24
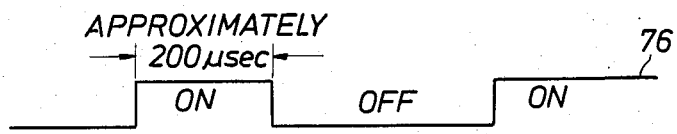
TAG TRANSMITTER 19

METHOD AND APPARATUS FOR NUCLEAR MAGNETIC RESONANT MEASUREMENT OF FLOW VELOCITY

BACKGROUND OF THE DISCLOSURE

This invention was made under U.S. Government Contract No. DE-AC01-79ET15465 and the U.S. Government has a nonexclusive, nontransferable, irrevocable, paid-up license to practice or have practiced for or on behalf of the U.S., this invention throughout the world.

This apparatus and method are directed to the problem of measuring flow velocity. In measuring velocity of a material having an element of interest, magnetic resonance techniques are utilized to obtain signals resulting from polarization of nuclei or electrons in an element of interest. For example, the element of interest may be hydrogen. Carbon compounds may be especially rich in free electrons subject to EMR measurement. It is possible to align the nuclei of hydrogen in a material. Other elements can be selected. The material flows through a pipeline at a velocity to be determined. The velocity of the flow is to be measured without intrusion into the pipeline. To this end, the pipeline is constructed with at least a section of pipe made of non-ferromagnetic material to enable the flowing materials (and hence the element of interest) to be exposed to a transverse magnetic field of specified intensity. In conjuction with this, first and second coils forming RF fields at right angles to the magnetic field are concentric around the pipe. In one embodiment of this apparatus, a first coil is used to achieve magnetic resonance between the imposed magnetic field intensity, the frequency of RF energy transmitted from the coil into the flowing material, and the particular element. The element is involved by either aligning the nuclei in NMR or unpaired electrons of the element in EMR. The velocity of this element can then be determined with the method and apparatus which are set forth herein.

It is only required that the element be available in sufficient quantity to provide a suitable amplitude output signal. That is, increases in the element population as might occur with increases in density or changes in the fill factor do not alter the data which is obtained through the use of the present method and apparatus. Rather, this method and apparatus works in conjunction with a relatively uniform magnetic field $H_o$ between opposing poles of a magnet of this field strength. The magnetic field first polarizes the element of interest to set the stage for obtaining an NMR or EMR response from the element. The magnet has a relatively long length. The field has a length which is sufficiently long to accommodate two spaced concentric coils. This magnetic field cooperates with a first coil and second coil. It is desirable that the polarized nuclei or electrons remain in the magnetic field for a period of time more or less comparable to $T_1$ to obtain suitable polarization which occurs at a rate determined by $T_1$. If this initial polarization is accomplished for the maximum velocity, then there is assurance that lesser flow velocities will be accompanied by even greater preliminary polarization. As will be understood, a modest degree of polarization (alignment of a small portion of the element of interest) achieves a sufficient output that data can be observed. Greater polarization of the element of interest, even to the extent of 100% thereof, does not change the velocity measurement so long as the output signal is sufficient to exceed noise levels and observable. In most petrochemical fluids and also including coal pipelines, the element of interest is hydrogen.

It has been discovered in this invention that the use of two coils, spaced from one another, is advantageous. The first coil is labelled a tag coil. This is a coil that first imposes an RF signal on the flowing element of interest. The frequency of this signal has a relation to the magnetic field intensity. This signal is periodically switched off and on. The RF signal causes the magnetically polarized nuclei to be rotated away from alignment with the magnetic field, ending polarization. Since the RF is switched off and on, this creates polarized and depolarized cylindrical slugs of material flowing through the pipe. As the slugs move through the pipe, the tagged (depolarized) hydrogen nuclei arrive at the detection coil downstream. The detected NMR signal at the second coil decreases abruptly on arrival of a tagged slug. The NMR signal changes again at the next interface between adjacent polarized and depolarized slugs of flowing material. By measuring the time between the application of the tag signal and the arrival of the tagged nuclei (depolarized) at the detection coil, the flow velocity can be measured. It will be understood that travel time is observed both when the tag is switched on and when the tag is switched off. In other words, each interface can be observed in transit.

An alternate embodiment of this apparatus utilizes a feedback loop to control the tag signal duty cycle. The tag modulation frequency then becomes proportional to flow velocity.

To achieve better results with this arrangement, the optimum is obtained by making the coils relatively short, by imposing a maximum separation distance between the tag coil and the detection coil. Preferably, the magnetic field is uniform across a span determined by a coil dimensions and coil spacing and includes an upstream portion having a length related to the maximum permissible flow velocity. On the other hand, as the flow velocity decreases, there is a problem of diffusion of the flowing material, and also the requirement that the transit time for the lowest speed of interest must be less than $T_1$ to prevent loss of the tagging effect. In other words, the tagged (depolarized) element will be repolarized if the flow between coils is sufficiently slow that the transit to the second coil is great compared to $T_1$. For relatively high resolution, the NMR pulse repetition rate must be relatively high compared to the flight time. This however degrades the signal to noise ratio. Accordingly, in a given spacing between the coils, the high end of the velocity measurement range is limited by the repetition rate which assures acceptable resolution, and the low end of velocity is limited by obtaining transit time less than $T_1$. Variations in the coil spacing are difficult; it is preferable to vary frequencies as opposed to moving coils.

Coil field dimensions limit slug definition and hence resolution. If the coil field is narrow, the slug is sharply defined and able to be more easily observed. The axial length of the flowing material polarized by the field of the coil can be effectively reduced by using a magnetic field gradient. In this manner, the effective length of the slug of flowing material is shorter than the physical length of the coil.

With the foregoing in view, the apparatus of this disclosure is defined as a magnetic resonance system for resonating either the nuclei or electrons of selected elements. NMR responses can be obtained from hydrogen. EMR responses can be obtained alternately from free electrons such as those associated with carbon in coal. In either case, the apparatus utilizes a relatively wide magnet which forms a fairly uniform magnetic field across a non-ferromagnetic pipe. This field is transverse to the flow of material of interest. First and second coils are located in this magnetic field. The first is a tag coil. It imposes an RF energy burst on the element of interest. The magnetic field polarizes or aligns the element of interest. The short RF burst from the tag coil depolarizes the element which then flows in a transit time to the second coil, a detection coil. Changes in NMR response at the second coil indicate variations in transit time and hence velocity.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a schematic of a magnet and coils showing a gradient arrangement; and

FIG. 4 is a timing chart of an interlaced signal sequence.

DETAILED DESCRIPTION OF THE PREFERRED EMBODIMENT

Figure 1:
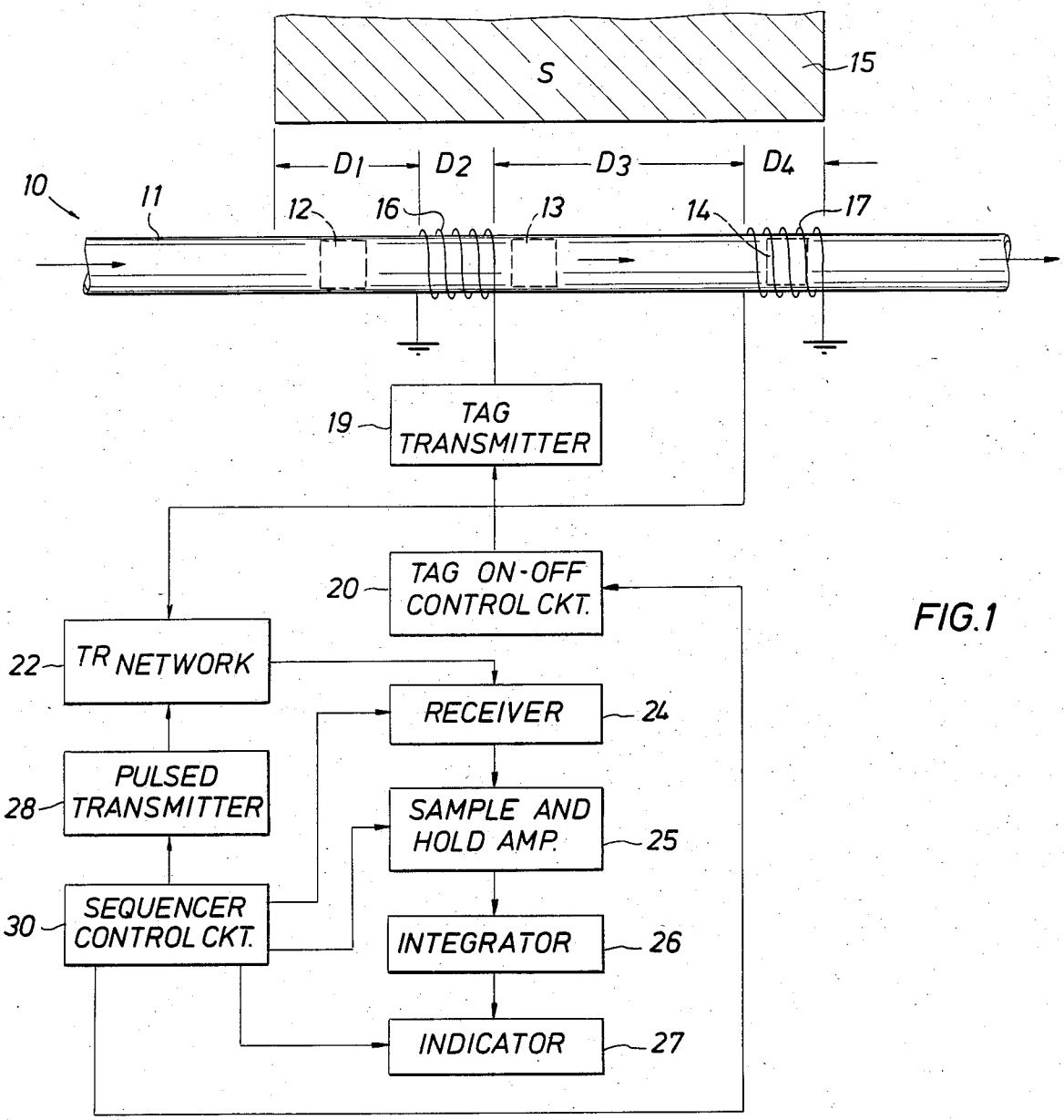
FIG. 1 is a schematic diagram of the preferred embodiment illustrating a magnet, tag coil and detection coil arranged relative to a pipeline for measuring velocity in the pipeline.

Attention is first directed to FIG. 1 of the drawings. There, the flow velocity measuring system is identified by the numeral 10. A pipe 11 delivers a flowing fluid of interest. The fluid is a mix of compounds including an element of interest. The element of interest may be hydrogen. An alternate is free electrons attributed to carbon. Other elements can be selected. The elements are of the sort to respond to magnetic resonance, either by polarizing the nuclei or free electrons of the element. The numeral 12 identifies a first slug of the element in the pipe 11. This refers to a moving slug of material in the pipe. It is moving from left to right as viewed in FIG. 1. A similar slug 13 is is also identified. Another slug 14 is also included. The slugs 12, 13 and 14 will be described respectively hereinafter as the polarized slug, tagged slug and detected slug.

A magnet 15 is used to impose a relatively uniform field on the pipe 11. The width of the magnet 15 is broken into four distances marked on FIG. 1. The distance $D_1$ should be sufficiently great that a substantial population of the element of interest is polarized. The distance $D_2$ is relatively narrow, a narrow coil dimension being desirable. The distance $D_3$ is preferably not so long that the transit time in that distance approaches $T_1$. The distance $D_4$ is sufficient in length that the detected slug 14 can be measured and a NMR response obtained.

A tag coil 16 fits within $D_2$. There is also a detection coil 17 at $D_4$. The tag coil 16 is connected with a tag transmitter 19. It is switched off and on by a tag control circuit 20. The coil 17 is connected with a transmit and receive circuit 22. This circuit forms a controlled sequence of operation for the coil 17 so that it is periodically used to transit and periodically to receive. The TR circuit 22 serves as a input circuit for a receiver 24. The receiver 24 is connected to a sample and hold amplifier 25. The amplifier 25 forms an output to an integrator 26. The integrator is connected to an indicator circuit 27 which is either a meter movement, other meter device, strip chart recorder or the like. FIG. 1 further discloses a pulsed transmitter. The preferred frequency is in the range of three to ten megahertz. It is pulsed off and on. The transmitter 28 is controlled by the sequencer circuit 30.

Figure 2:
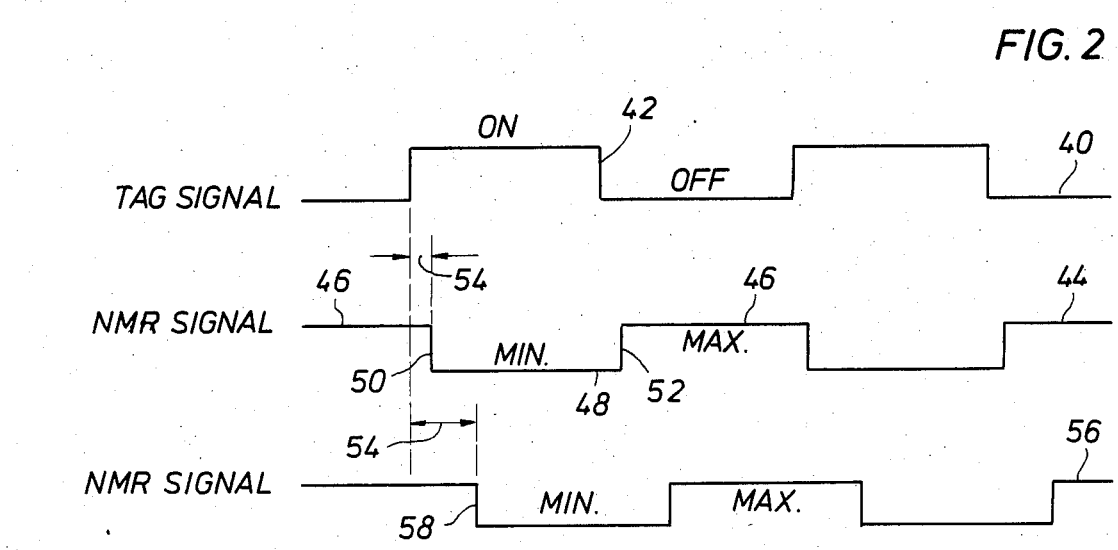
FIG. 2 is a timing chart showing the movement of tagged flowing material.

The sequencer circuit 30 controls the transmitter 28 and the receiver 24. It also controls operation of the sample and hold amplifier 25 and the indicator 27. Additionally, it controls the control circuit 20. That circuit in turn operates the tag transmitter 19 to form signals for the coil 16 in a controlled sequence. Sequencing is understood best by referring to FIG. 2 of the drawings. In FIG. 2, the wave form 40 identifies the control signal which is applied to the tag control circuit 20. The wave form 40 is typically in the range of 5 to 20 hertz. When tagging occurs, it is accomplished in bursts at 1600 hertz; during a 10 hertz "on" cycle, 80 RF bursts occur to tag the flowing material. While one RF burst might suffice, several RF bursts are used to enable the output NMR signal to be integrated and thereby improve the signal to noise ratio. The circuit 20 switches the tag transmitter 19 off and on for repeated bursts to tag the flowing material and to enable signal improvement by integration. Assume, that the element of interest is hydrogen, and further assume that a three megahertz signal matches the field strength formed by the magnet 15 to thereby initiate NMR response from the element of interest. This NMR relationship can be best be understood by comparing the three slugs of material in the pipe 11. First of all, the material at 12 is flowing in the magnetic field having an intensity of $H_o$ Which relates to the three megahertz signal. The material in the slug 12 becomes polarized. That is, it is polarized by the magnetic field. This achieves an initial alignment of the element nuclei (or electrons as the case may be) of interest, perhaps all of it, but at least a sufficient portion thereof to form an output signal. This is accomplished after the nuclei or unpaired electrons of the element of interest have been in the magnetic field $H_o$ for a duration approaching $T_1$. It is not necessary that complete polarization be achieved so long as adequate polarization is obtained. Adequate polarization refers to polarization which is sufficient to provide adequate signal output for the operation of this device. It may be less than 100% polarization.

If the coil 16 is off, then the flowing material simply becomes even more completely polarized as it moves across the face of the magnet 15 and passes through the distances $D_1$, $D_2$ and $D_3$ added together. This slug of material at 12 may become completely polarized, but again, total polarization is not essential. Subsequently, that slug is within the confines of detection coil 17 and is able to provide an NMR (or EMR as the case may be) response to RF pulses transmitted from the detection coil 17.

Assume for the moment that the polarized slug 12 eventually encounters the tag coil 16 at an instant when the tag coil 16 is provided with RF pulses and hence transmits a RF energy into the slug 12. When this occurs, the element of interest in the slug 12 is depolarized. The slug then flows down the pipe 11 to the position 13. At this point, the slug is described as tagged, referring to the fact it is now depolarized. The RF pulse transmitted from the transmitter 19 through the coil 16 accomplishes depolarization or tagging. The tagged material is now exposed to the magnetic field $H_o$ and repolarization is initiated. This requires an interval of time which is a function of $T_1$. Assuming for the moment that repolarization is not accomplished, the slug travels on through the pipe and eventually encounters the detection coil 17. At the detection coil 17, the depolarized or tagged material changes the NMR response of the material to RF pulsed interrogation.

There are front and rear interfaces for the slug 14. The two interfaces are assumed to be sharply defined. In practice, they are not so sharply defined and some diffusion may occur due to turbulence in the flow. Even so, there is in fact an adequate change in response at the detection coil 17 observing the tagged and untagged flowing material in the pipe 11. Thus, when the tagged slug comes into the vicinity of the coil 17, it provides an NMR response which is different from that of untagged material. The NMR response is smaller in amplitude. With this in view, it will now be observed in FIG. 2 of the drawings that the positive going pulse 42 for the tag signal indicates the interval during which the tag transmitter 19 is operated to tag the flowing slug 13. It is tagged because the coil forms the RF signal which depolarizes the slug 13. Reference is made to the signal 44 from the detection coil. The transmitter 28 is operated for the interval 46. It is switched off for the interval 48. While it is on, it transmits a pulse to the detected slug 14. Assume that this slug is a tagged slug which was tagged earlier when it passed through the coil 16. As the slug 14 flows into the near vicinity of the detection coil 17, and is subjected to a transmitted RF pulse, a change will occur in the wave form 44 which is indicative of tagging. There is a change between the larger and smaller NMR signal outputs. When the flowing material is interrogated by transmitting a pulse, the NMR signal output from the detection coil 17 is maximum when the material then being interrogated has not been tagged. The opposite is also true, namely, the output signal is minimum because the material then being interrogated by the NMR transmitted pulses is tagged or inadequately polarized.

Assume as a matter of scale (depending on flow rates and the particular element of interest, physical spacing of the coils and other facts) that only 2% of the material is polarized after tagging while 63% of the material is polarized when it has not been tagged. In this instance, output amplitude will be approximately 30 times greater.

The test circuitry includes the following components, these components being described along with their sequence of operation. This circuitry is to be distinguished from the tag transmitter circuitry. Going now to FIG. 1, the control circuit 20 switches on the tag transmitter 19 for a specified instant in a timed sequence subject to the sequencer control circuit 30. Assume that it forms a pulse which is quite large, perhaps instantaneous power of 100,000 watts. As will be understood for purposes of exaggeration, the scale of the transmitted pulse to a received pulse is not particularly critical and is otherwise given merely as representative, not necessarily to constrain the practice of the invention. Thus, the tag transmitter circuitry in reality is relatively simple including the tag transmitter 19 and the transmitter coil 16. This transmits the pulse under control of the sequencer 30 described above.

First of all, when this large pulse is formed in the coil 16, there is always the possibly of directly coupled pulse formed in the coil 17. To this end, the TR network 22 is switched off at this instant. This avoids direct coupling from coil 16 to coil 17.

The interrogation or test circuit utilizes the pulse transmitter 28 to form a pulse for the coil 17. That transmitted pulse of perhaps 1,000 watts peak power is sent through the TR network 22 to the coil 17. When the TR network enables the transmitted pulse to pass, the receiver 24 is isolated or blanked off. The TR network then flips, switching off communication from the transmitter 28 to the coil 17; it simultaneously connects the coil 17 so that any signal in the coil 17 is supplied to the receiver 24. Assume that the receiver is switched for a few microseconds. During that interval, it will form an output signal for the sample and hold amplifier 25. This is perhaps more readily understood by viewing FIG. 4. The curve 70 shows the transmitter switched on; at this point, the receiver 24 is off. The receiver is turned on while the transmitter 28 is off, both happening under control of the TR network 22. Some peculiar wave-form such as the representative wave-form at 74 in FIG. 4 is received. A value is obtained therefrom by the sample and hold amplifier 25. Thus, the test circuit includes the pulse transmitter 28 which forms the signal protecting, the TR network 22 and the receiver. The receiver output of course is supplied to the sample and hold amplifier.

The NMR interrogate signal has a change at 50, and a later change at 52. The changes 50 and 52 describe transitions between the peaks 46 and 48. The two transitions are offset from the transitions of the pulse 42 in the tag signal 40. This time interval 54 is a function of flow velocity.

In FIG. 2, the numeral 56 identifies another wave form. The wave form 56 shows a transition at 58 corresponding to the transition 50. The time delay is greater; hence, the time interval 54 is much longer. This time interval 54 can be varied dependent on flow rate.

Consider as a possibility continuous scanning of the NMR output signal. That is, the output from the detection coil 17 is periodically tested for NMR amplitude. One technique of NMR output detection is to apply a three megahertz pulse of about three microsecond duration, best shown in FIG. 4 at 70. The pulse repetition rate is about 1600 pulses per second. This sampling rate tests the material 1600 times per second to provide sufficient data points to thereby fully describe the NMR response. Through the use of a receiver 24 designed for relative high sensitivity, low noise and rapid recovery and with a band width of about 300 kilohertz, the profile of the tagged and untagged material flowing through the detection coil 17 can be determined. The data points will have the shape of the wave forms 44 and 56, differing in time delay 54. This time delay 54 is indicative of the flow velocity. The several data points are output from the sample and hold amplifier 25 and are shown at 72 in FIG. 4. The data points are supplied to the integrator 26 which yields the approximate rectangular wave form 56 shown in FIG. 2. Compared with the sampling rate of 1600 hertz, a suitable tag rate is perhaps 5-20 hertz. The RF burst from the tag transmitter 16 thus shapes the wave form at 40.

There is the possibility of signal interference between the coils 16 and 17. They are physically aligned with one another and are relatively close. They have only a few turns. Long coils are generally undesirable. There is the risk of transmitting signals from the coil 16 to the coil 17. Longer coils increase the coil interference. An interlaced operation is preferable to avoid direct coupling between the two coils. It will be recalled that one suggested sampling rate at the detection coil 17 is 1600 samples per second, this being approximately three microsecond bursts occurring every 600 microseconds. Not only does this provide a light duty cycle, but this also enables the NMR receiver 24 connected to the detection coil 17 to be switched off and on in an interlaced fashion so that the receiver 24 is isolated from the transmitter. The receiver 24 is thus switched on to observe the expected NMR response 74 (FIG. 4) after each interrogate transmitter burst 70. With a cycle beginning with a three microsecond burst 70 from the transmitter 28, the receiver 24 is then operated for an interval such as perhaps 200 microseconds as shown at 76. Accordingly, the receiver 24 is switched on for 200 microseconds and is switched off for about 400 microseconds to comprise the 600 microsecond cycle shown at 76. During the 200 microsecond interval after a transmission when the receiver 24 is turned on, the tag transmitter 19 is switched off (see signal 78). During the remainder of the 400 microsecond interval, the tag transmitter 19 can be turned on (see signal 78). When the tag transmitter 19 is turned on for only a portion (not necessarily all) of the 400 microsecond interval, and this transmitter pulse is repeated for several pulses, the tag impact is integrated by the material. In other words, even though the tag transmitter 19 is switched on for only a part of the 600 microsecond period, the tagged slugs of material are integrated to become one slug having a length dictated by flow rate. The actual slug movement when the tag transmitter is off part of the 600 microsecond interval is insignificant, and is substantially zero. Thus the tag on signal 42 enables transmission of between 40 and 160 RF pulses for a tag signal envelope of between 5 and 20 hertz with RF bursts occurring at 1600 hertz. These rates are representative and may vary.

In summary, the receiver 24 is on when both transmitters are off. The transmitter 28 is on when the receiver 24 is off and also when the transmitter 19 is off. In fact, when either transmitter is on, the other transmitter is off.

There is a scale factor which comes into play depending on the velocity and diameter of the pipe. This also relates to the length of the coil. As will be understood, the portion of material tagged by the coil is not precisely defined within the confines of the coil geometry. There is some loss of resolution at the ends of the coil. To this end, maximum allowable spacing is set out by the $T_1$ of the material. Attention is next directed to FIG. 3 of the drawings for a feature improving slug definition. In FIG. 3, a magnetic field with gradient is illustrated. The embodiment 100 shown in FIG. 3 incorporates a magnet with pole pieces 101 and 102 opposite a conduit 103. In the conduit 103, the element of interest is flowing. There exists for this particular element a relationship wherein the field strength $H_o$ is related to the frequency $F_o$. A magnetic field different from $H_o$ does not enable resonance at the particular frequency $F_o$ to occur. Flowing material is thus exposed to a magnetic field $H_1$ which different from the required field for resonance represented by the symbol $H_o$. The magnet is constructed with tapered faces as a convenient means for obtaining a magnetic field gradient. The gradient passes through the value of $H_o$. This value $H_o$ is achieved at the magnet face portion 104. This gradient exposes the flowing material to the requisite field intensity. The slug of material at 105 is exposed to the tag coil 106 for transmission of an RF tone burst having the requisite frequency $F_o$ to accomplish resonance with the species of interest coacting with the requisite field strength $H_o$. The slug 105 is thus confined to a specific region. In light of this fact, the coil 106 can be longer then the slug 105; the slug 105 is narrow because the end portions of the coil 106 coact with flowing material which does not have the required initial polarization. Thus, the slug 105 is exposed to the magnetic field of proper intensity and RF tone bursts to accomplish the requisite polarization. The slug 105 is relatively narrow and is more sharply defined.

While there may be other intensities such as field strength $H_1$ and $H_2$, the interaction between the RF frequency and field intensity is not accomplished except at the slug 105 within the gradient magnetic field defining the slug 105.

The narrow width obtained by field gradient is true of the tag coil 106. This narrow width can also be obtained in the detector coil 107. While the coil 107 may be quite long, there is a region within the coil 107 where the magnetic field strength again is the requisite value $H_o$. This defines a flowing slug 108 which is exposed to the interacting field strength and RF frequency. So to speak, the use of magnetic field gradients narrows or shortens the effective length of both coils. The incorporation of additional coil turns and the extension of the coils lengthwise along the pipe does not increase their size with the requisite decrease in accuracy or sensitivity.

Accordingly, FIG. 3 shows a system whereby magnetization across the pipe 103 is accomplished. In the region of the tag coil 106, there is a gradient in the magnetic field which provides the requisite field strength $H_o$ to interact with the coil frequency $F_o$ to shorten or narrow the flowing slug of material excited by the transmitted RF pulse. This shortened flowing slug of material in the field $H_o$ is the tagged material. Equally, the detector coil 107 can be quite long but its effective length is shortened by locating it in a magnetic field having a gradient passing through the requisite valve $H_o$. A positive gradient is one wherein the flowing material is first exposed to a more intense field and flows through the pipe further to a less intense magnetic field. In like fashion, a negative gradient occurs when the flow is in the opposite direction. It will be observed that FIG. 3 includes similar positive gradient magnetic field areas. If desired, a negative gradient could also be used.

Through the use of gradient in the magnetic field at both the tag coil and the detector coil, system sensitivity can be sharpened, enabling more precisely defined measurements.

While the foregoing is directed to the preferred embodiment, the scope of the present disclosure is determined by the claims which follow.

What is claimed is:

1. Flow velocity measuring apparatus for use with a pipe made of non-ferrous material wherein flowing material entrains n element of interest subject to nuclear magnetic resonance (NMR), and wherein the apparatus comprises:
   (a) shaped magnet means forming a magnetic field across a pipe, the field having a gradient therein;
   (b) a tag transmitter for forming RF pulses;
   (c) a tag coil connected to said tag transmitter and positioned to impress a first RF pulses field acting on the flowing element;
   (d) wherein the RF field and magnetic field cooperate to change the flowing element to a disturbed state compared with an aligned state achieved by the magnetic field;
   (e) a downstream located interrogation coil for detecting the aligned or disturbed states of the flowing element;
   (f) NMR interrogation circuit means connected to said interrogation coil for obtaining NMR response indicative of the flowing element time of travel between said tag coil and said interrogation coil; and
   (g) wherein said magnet means forms the field gradient in the region of said tag coil to define a magnetic field intensity interacting with the RF pulse to achieve a specified NMR response limited in length along the pipe by the field gradient.

2. The apparatus of claim 1 wherein said tag coil has a finite width and forms a field of finite width in the pipe.

3. The apparatus of claim 1 wherein tag coil is periodically pulsed off and on to form a leading edge and trailing edge to a flowing portion of the element of interest, the portion having a disturbed state.

4. The apparatus of claim 3 wherein said NMR interrogation circuit means recognizes the arrival one edge of the portion at said interrogation coil.

5. Flow velocity measuring apparatus for use with a pipe made of non-ferrous material wherein flowing material entrains an element of interest subject to nuclear magnetic resonance (NMR), and wherein the apparatus comprises:
   (a) magnet means forming a magnetic field across a pipe;
   (b) a tag transmitter for forming RF pulses;
   (c) a tag coil connected to said tag transmitter and positioned to impress a first RF pulsed field acting on the flowing element;
   (d) wherein the RF field and magnetic field cooperate to change the flowing element to a disturbed state compared with an aligned state achieved by the magnetic field;
   (e) a downstream located interrogation coil for detecting the aligned or disturbed states of the flowing element;
   (f) NMR interrogation circuit means connected to said interrogation coil for obtaining NMR response indicative of the flowing element time of travel between said tag coil and said interrogation coil; and
   (g) means for timing operation of said tag coil for a relatively long interval by operation of said tag transmitter, and including a separate interrogation transmitter in said NMR interrogation circuit means, and wherein said timing means permits only one of said transmitters to be operated at any instant.

6. The apparatus of claim 5 wherein said magnet means spans a first distance which is sufficiently long to enable the element to achieve an initial aligned state, said tag coil having a second length along the pipe sufficiently long to change the element to a disturbed state, a third distance along the pipe between said tag coil and interrogation coil less than the length wherein the disturbed state is terminated by restoration of the element to the aligned state, and a fourth length along the pipe for the interrogation coil sufficient to couple the element flowing in the pipe either in the disturbed state or the aligned state with the interrogation coil on operation thereof.

7. The apparatus of claim 6 wherein said tag coil includes N turns and said interrogation coil includes M turns where N and M are the numbers of turns, and said coils are axially aligned and spaced from one another by the third distance, the distance between said coils being equal to or less than a distance determined by the minimum flow rate of the element of interest.

8. The apparatus of claim 7 wherein said tag coil cooperates with said magnet means to form a magnetic field in the region of said tag coil, the field having a gradient to thereby narrow the effective width of interaction with the element to form the disturbed state in the element.

9. The apparatus of claim 7 wherein said interrogation coil cooperates with said magnet means to form a magnetic field in the region of said interrogation coil, the field having a gradient to thereby narrow the effective width of interaction to obtain NMR response with the element.

10. The apparatus of claim 7 wherein said interrogation coil cooperates with said magnet means forming a magnetic field in the region of said interrogation coil, the field having a gradient to thereby narrow the effective width of interaction to obtain NMR response with the element.

11. The apparatus of claim 10 wherein said magnet means includes two magnet pole pieces facing one another and on opposite sides of the pipe, and said pole pieces have faces selectively spaced to vary magnetic field intensity to obtain magnetic field gradients.

12. A method of determining velocity along a non-ferrous pipe of a flowing material entraining an element of interest responsive to NMR interrogation wherein the method comprises the steps of:
   (a) imposing a magnetic field having a gradient therein across a pipe for a specified length;
   (b) periodically activating a tag coil with an RF pulse acting on the element of interest to change the element of interest from an aligned state with the magnetic field to a disturbed state;
   (c) testing the flowing element of interest downstream and along the pipe for the disturbed element to be observed;
   (e) wherein said tag coil RF pulse field is narrowed by the gradient in the magnetic field along the pipe, and the magnetic field gradient interaction with the RF pulse field jointly defines the narrowed field.

13. The method of claim 12 wherein the velocity determining step utilizes an interrogation coil downstream of the tag coil along the pipe, and the interrogation coil field is narrow by imposing a gradient on the magnetic field coacting with the RF pulse field of the interrogation coil.

14. The method of claim 13 wherein said tag coil and interrogation coil are axially aligned and concentric about the pipe and both are within the magnetic field across the pipe.

15. The method of claim 14 wherein only one of the tag coil and interrogation coil is forming an RF pulse at any instant.

16. The method of claim 12 wherein the tag coil is operated to form a plurality of short RF pulses sufficiently close in time that the flowing material element disturbed by the pulses is integrated to form a single flowing material element portion in the pipe between leading and trailing edges.

17. The method of claim 16 wherein said tag coil is switched off when an interrogation coil is switched on to form an RF pulse for NMR interrogation in the testing step.

18. The method of claim 14 wherein the effective interrogation width of the interrogation coil is narrowed by a gradient in the magnetic field formed by a magnet having a stepped face.

19. A method of determining velocity along a nonferrous pipe of a flowing material entraining an element of interest responsive to NMR interrogation wherein the method comprises the steps of:
(a) imposing a magnetic field across a pipe for a specified length;
(b) periodically activating a tag coil connected to a tag transmitter with several RF pulses acting on the element of interest to change the element of interest from an aligned state with the magnetic field to a disturbed state, the disturbed element of interest having a leading edge and trailing edge and comprising a plug of flowing material;
(c) testing the flowing element of interest downstream along the pipe for the disturbed plug of the element to be observed;
(d) determining the velocity by the transit time required for the disturbed plug of the element to be observed downstream;
(e) wherein the several RF pulses collectively form a single flowing plug of the disturbed element having the leading edge and trailing edge, and wherein the step of testing is conducted by periodically forming RF pulses at an interrogation coil which pulses observe the change at the interrogation coil between the disturbed state and aligned state of the flowing plug of the element of interest to thereby detect passage of the plug of disturbed element; and
(f) operating the interrogation coil for an interval to transmit an RF pulse from the interrogation coil into the flowing material element wherein the RF pulse is formed by a test transmitter, and operating an interrogation receiver for an interval thereafter to observe NMR response from the element of interest and wherein the receiver is turned on when the test transmitter is turned off and the tag transmitter is turned off.

20. The method of claim 19 including the step of testing periodically by forming test RF pulses from the interrogation coil connected to a test transmitter wherein the test pulses are separated in time sufficient to receive an NMR response at the interrogation coil, and said RF pulse responses vary dependent on the aligned and disturbed state of the flowing material element.

21. The method of claim 20 wherein the test pulses are about 3 microseconds in length, and the interrogation coil is operated as a receiver coil for an interval sufficient to obtain an NMR response from the flowing material element.

* * * * *